United States Patent [19]
Ohori et al.

[11] Patent Number: 5,972,437
[45] Date of Patent: *Oct. 26, 1999

[54] METHOD FOR FABRICATING A THIN FILM SEMICONDUCTOR DEVICE

[75] Inventors: Tatsuya Ohori, Tokyo; Michiko Takei, Kanagawa; Hongyong Zhang, Kanagawa; Hiroshi Kuroki, Kanagawa, all of Japan

[73] Assignee: Semiconductor Energy Labortory Co., Ltd., Kanagawa-ken, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/799,203

[22] Filed: Feb. 13, 1997

[30] Foreign Application Priority Data

Feb. 20, 1996 [JP] Japan .................................. 8-058332

[51] Int. Cl.$^6$ .............................. B05D 3/06; H01L 29/78
[52] U.S. Cl. ........................ 427/539; 427/534; 427/535; 427/255.3; 427/309; 438/778; 438/786
[58] Field of Search ................... 427/535, 534, 427/539, 578, 255.3, 255.2, 255.1, 309; 438/786, 778, 149

[56] References Cited

U.S. PATENT DOCUMENTS

| | | |
|---|---|---|
| 4,837,185 | 6/1989 | Yau et al. ............................. 437/228 |
| 5,395,804 | 3/1995 | Ueda ..................................... 437/233 |
| 5,550,397 | 8/1996 | Lifshitz et al. ..................... 257/412 |
| 5,576,071 | 11/1996 | Sanahu ................................. 427/534 |
| 5,614,270 | 3/1997 | Yeh et al. ............................ 427/539 |
| 5,624,873 | 4/1997 | Fonash .................................. 437/21 |

FOREIGN PATENT DOCUMENTS

| | | |
|---|---|---|
| 60-039649 | 3/1985 | Japan . |
| 61-260219 | 11/1986 | Japan . |
| 4-177735 | 6/1992 | Japan . |
| 4-177736 | 6/1992 | Japan . |
| 7-094751 | 4/1995 | Japan . |

OTHER PUBLICATIONS

Asai et al, Abstracts of the 1992 International Conference On Solid State Devices and Materials, pp. 55–57 no month data.

*Primary Examiner*—Roy V. King
*Attorney, Agent, or Firm*—Fish & Richardson P.C.

[57] ABSTRACT

To promote the characteristic of an interface between a gate insulating film and a semiconductor and control the threshold voltage, in forming the insulating film, a surface on which the insulating film is to be formed is previously exposed to activated oxygen and thereafter, the insulating film is formed on the surface, or in steps of manufacturing a thin film transistor, the insulating film is formed with monosilane, dinitrogen monoxide and oxygen as raw materials.

14 Claims, 8 Drawing Sheets

METHOD FOR FABRICATING A THIN FILM SEMICONDUCTOR DEVICE

BACKGROUND OF THE INVENTION

1. Field of the Invention

The present invention relates to the constitution of an insulating gate type field effect semiconductor device (generally referred to as a thin film transistor or TFT) using a thin film semiconductor formed on an insulating substrate and a method of making thereof.

2. Description of Related Art

There has been a technology for making an active matrix type liquid crystal display device by forming a thin film transistor on an inexpensive glass substrate.

According to an active matrix type liquid crystal display device, TFTs are arranged to respective pixels of several millions which are arranged in a matrix, and electric charge inputted and outputted to and from each of pixel electrodes is controlled by a switching function of TFT.

The operational behavior of TFTs which are arranged at a pixel portion in a matrix, can visually be confirmed as a liquid crystal display. For example, in the case of a liquid display of normally black, portions where TFTs are not operated are represented as black spots in white display.

In this way, the malfunction of TFTs considerably deteriorates the appearance and therefore, high reliability is required to all of several millions of TFTs.

The problem here is the characteristic of an interface between a gate insulating film and a semiconductor film formed beneath the gate insulating film.

The deterioration in electric properties at the interface gives rise to cause a line defect in a liquid crystal display device and finally to cause malfunction in the display device. Therefore, promotion of the properties is needed.

Further, according to TFTs using a crystalline silicon film, if the crystalline silicon film constituting channel forming regions is intrinsic, the threshold value is generally shifted to rather negative (−) side from 0 V and the rise start voltage tends to be −2 through −4 V, in the case of a N channel type one. As a result, the tendency of constituting the normally ON state (a state rendered ON even if the gate voltage is 0 V) becomes conspicuous.

Under the normally ON state, for example, if TFTs are used as switching elements, current is made to flow even if the gate voltage is 0 V. Accordingly, in order to make a switch to be in the OFF state, the gate voltage needs to be always biased to the positive (+) side, and current consumption is increased in a circuit constituted by using the TFTs, or a circuit for applying the bias voltage may be needed.

In order to solve the problem, conventionally, even if TFTs of N channel type are formed, a threshold value control where a P-type impurity, for example, boron is doped to the crystalline silicon film comprising the channel forming region whereby the threshold voltage is shifted to the positive (+) side. As a result, TFTs in the normally OFF state (a state rendered OFF when the gate voltage is 0 V) can be formed. However, in order to carry out the threshold value control, a number of steps of manufacturing is increased which hampers reduction in manufacturing cost.

SUMMARY OF THE INVENTION

It is a first object of the present invention to resolve these problems and to promote electric properties at an interface between a gate insulating film and a semiconductor film formed beneath the gate insulating film. Moreover, it is a second object thereof to enable to control shifting of the threshold voltage in the positive direction.

In order to resolve the above-described problems, the present invention is provided with the following constitutions.

In forming an insulating film, a surface on which the insulating film is to be formed is previously exposed to activated oxygen and thereafter, the insulating film is formed on the surface.

Further, in forming an insulating film in steps of manufacturing a thin film transistor, a semiconductor layer is exposed to activated oxygen and thereafter, the insulating film is formed on the semiconductor layer.

Also, in steps of manufacturing a thin film transistor, an insulating film is formed with monosilane, dinitrogen monoxide and oxygen as raw materials.

According to the present invention, oxygen is introduced in a reaction chamber at a flow rate of 100 to 300 SCCM and a high frequency (13.56 MHz) is applied in a range of power of 50 to 500 W. in order to activate oxygen.

Also, instead of plasma CVD (Chemical Vapor Deposition), gaseous phase processes of LPCVD (Low Pressure Chemical Vapor Deposition) process, photo CVD process, plasma CVD process applied pulse waveforms and the like may be used.

DETAILED DESCRIPTION OF THE PREFERRED EMBODIMENTS

Embodiment 1

Figure 1A:
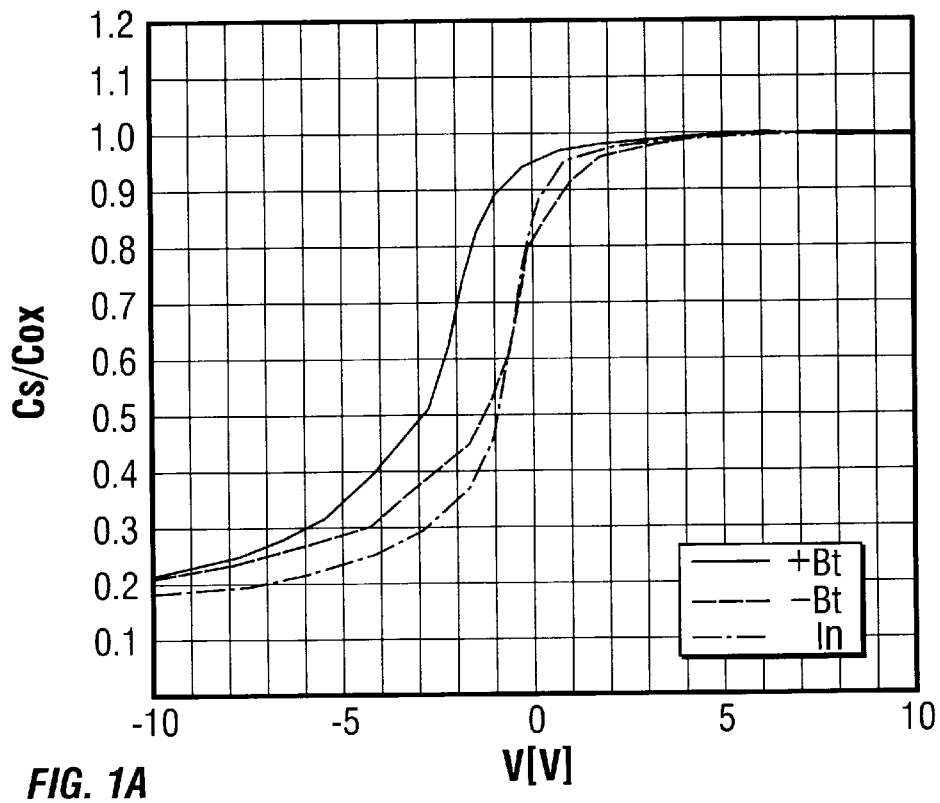
FIGS. 1(A) and 1(B) are diagrams showing C-V characteristics according to a first embodiment of the present invention.

This embodiment shows an effect on electric properties at an interface between a gate insulating film and a semiconductor film formed beneath the gate insulating film according to the present invention.

Firstly, a P-type single crystal silicon wafer having the resistivity of 2 to 3 Ω cm was used as a sample and the surface of the P-type single crystal silicon wafer was cleaned by oxygen activated into a plasma state before forming a $SiO_xN_y$ film (hereinafter, abbreviated as SiON film) on the wafer.

Conditions of processing the surface of the silicon wafer by oxygen plasma were as follows. Firstly, the pressure in a processing chamber was maintained at 0.1 to 10 torr, or 0.3 torr according to this embodiment, oxygen was introduced in the chamber to flow at a flow rate of 200 SCCM, and oxygen was brought into a plasma state by applying RF power of 100 W thereon. The surface of the silicon wafer was treated by oxygen plasma in this way. The treatment was carried out for 30 seconds to 3 minutes, or 1 minute according to this embodiment.

Thereafter, the inside of the processing chamber was maintained at the vacuum degree of $1\times10^{-4}$ to $1\times10^{-5}$ torr whereby, impurities caused by the oxygen plasma treatment were discharged from the chamber.

According to this embodiment, the operation was repeated three times. That is, after discharging impurities, the inside of the processing chamber was again maintained at the vacuum degree of 0.3 torr, oxygen was introduced at a flow rate of 200 SCCM, 100 W of RF power was applied whereby oxygen was brought into a plasma state, the treatment was carried out for 1 minute and thereafter, the inside of the processing chamber was maintained at the vacuum degree of $1\times10^{-4}$ to $1\times10^{-5}$ torr. Therefore impurities caused by the oxygen plasma treatment were discharged from the chamber. Further, the treatment was again carried out by using oxygen plasma and impurities caused by the oxygen plasma treatment were discharged.

A SiON film was formed on the surface of the silicon wafer which had been processed as described above by a thickness of 1000 Å. Conditions of forming the SiON film were as follows.

RF power; 200 W

Gas flow rate; $SiH_4$: 10 SCCM, $N_2O$: 200 SCCM

Gas pressure; 0.3 torr

Film forming temperature; 350° C. to 400° C.

Further, an aluminum electrode was formed in contact with the silicon wafer through sputtering and in addition thereto an aluminum electrode was provided on the SiON film whereby a sample for measurement was prepared.

Further, in order to show the effect of the present invention, measurement of C-V characteristic was carried out. Firstly, the characteristic was measured under the frequency of 1 MHz and by varying the voltage from −10 V to 10 V, and B-T treatment was carried out at 150° C. for 1 hour under a nitrogen atmosphere by applying −17 V to the aluminum electrodes on the silicon oxide film. Thereafter, the C-V characteristic was again measured under a frequency of 1 MHz and by varying the voltage from −10 V to 10 V. Further, B-T treatment was carried out at 150° C. for 1 hour under a nitrogen atmosphere by applying a voltage of +17 V to the aluminum electrode on the silicon oxide film. Further, the C-V characteristic was again measured under the frequency of 1 MHz and by varying the voltage from −10 V to 10 V.

The results are shown as FIG. 1(A).

In FIG. 1(A) notation In designates a sample which has not been subjected to BT treatment, notation −BT designates a sample which had been subjected to B-T treatment by applying the voltage of −17 V and notation +BT designates a sample which had been subjected to B-T treatment by applying a voltage of +17 V.

Figure 1B:
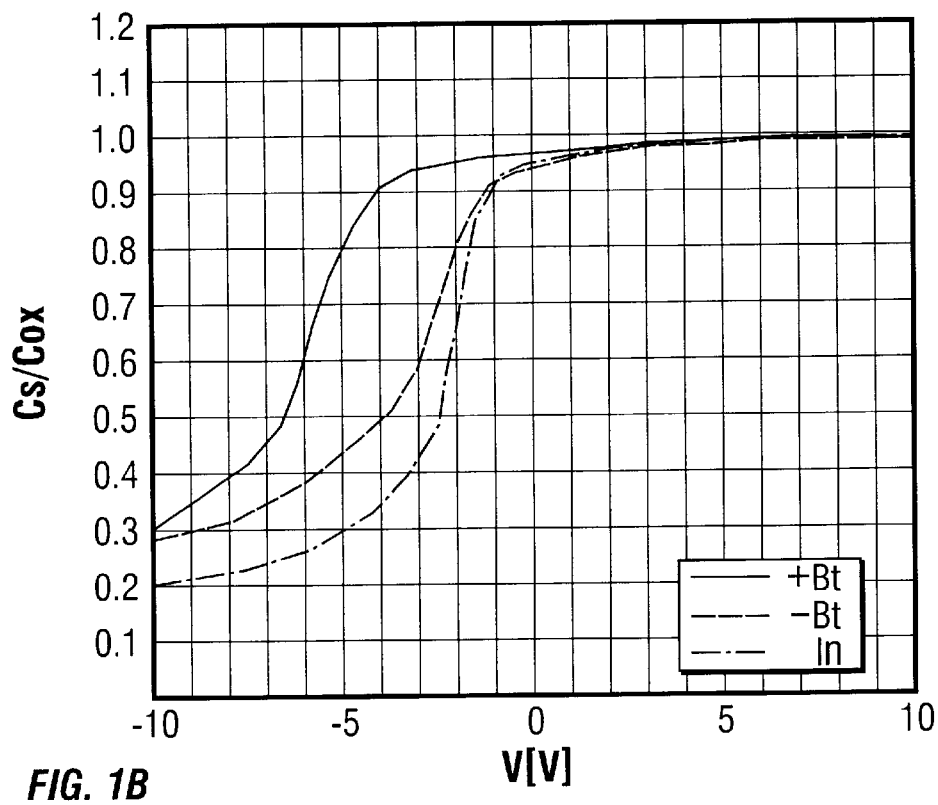

For comparison, measurement results of C-V characteristic of sample not subjected to the oxygen plasma treatment according to the present invention are shown in FIG. 1(B).

There figures shows that the flat band voltage is shifted in the positive direction by carrying out the oxygen plasma treatment in accordance with the present invention and also the BT shift becomes smaller, compared with the sample which had not been subjected to the oxygen plasma treatment. That is, it shows that the state of the interface was improved.

Figure 2A:
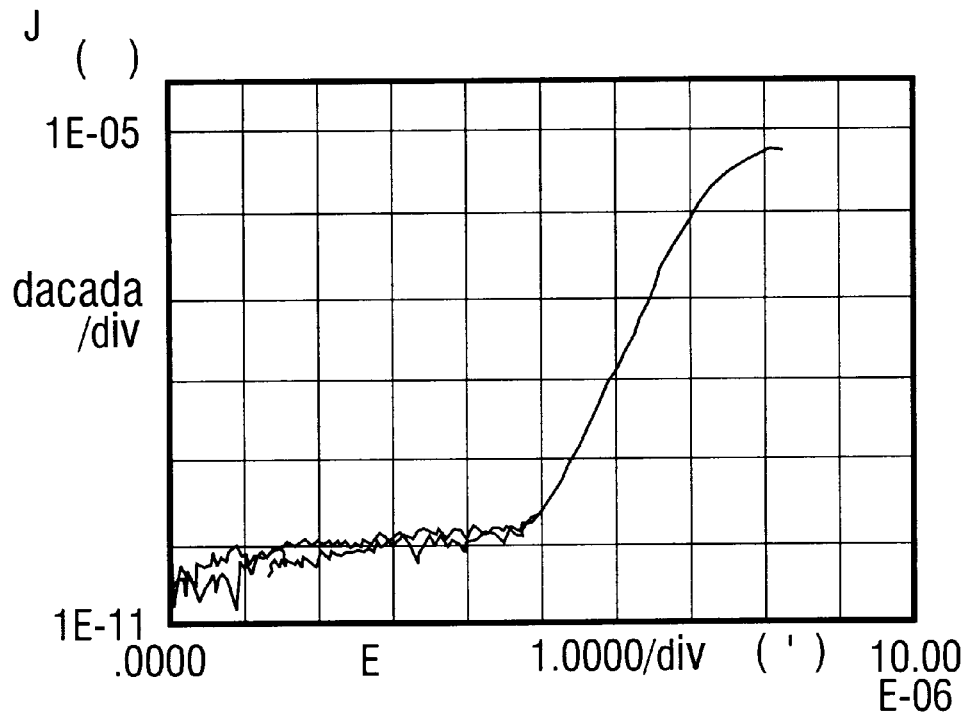
FIGS. 2(A) and 2(B) are diagrams showing relations between field intensity and current according to a first embodiment of the present invention.
Figure 2B:
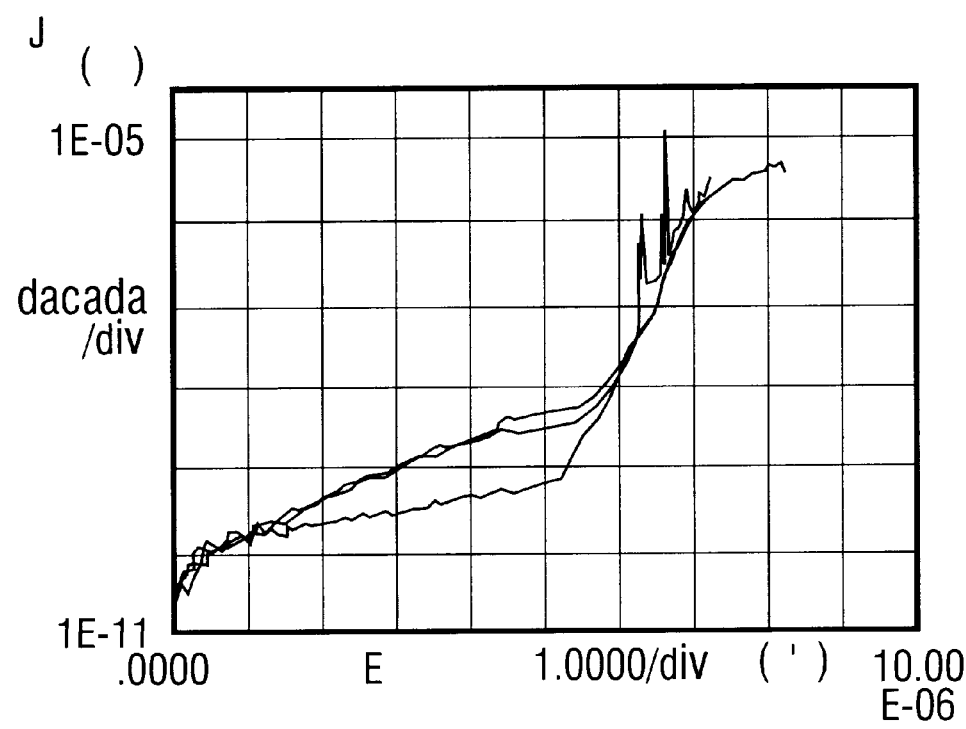

Relations between field intensity and current provided by the samples prepared in this embodiment, are shown in FIGS. 2(A) and 2(B) with the field intensity as abscissa and the current as ordinate. Also in this case FIG. 2(B) shows measurement result for the sample which had not been subjected to the oxygen plasma treatment for comparison.

There show that the leakage current is smaller in the sample subjected to the oxygen plasma treatment than that in those that not subjected to the oxygen plasma treatment.

Figure 3:
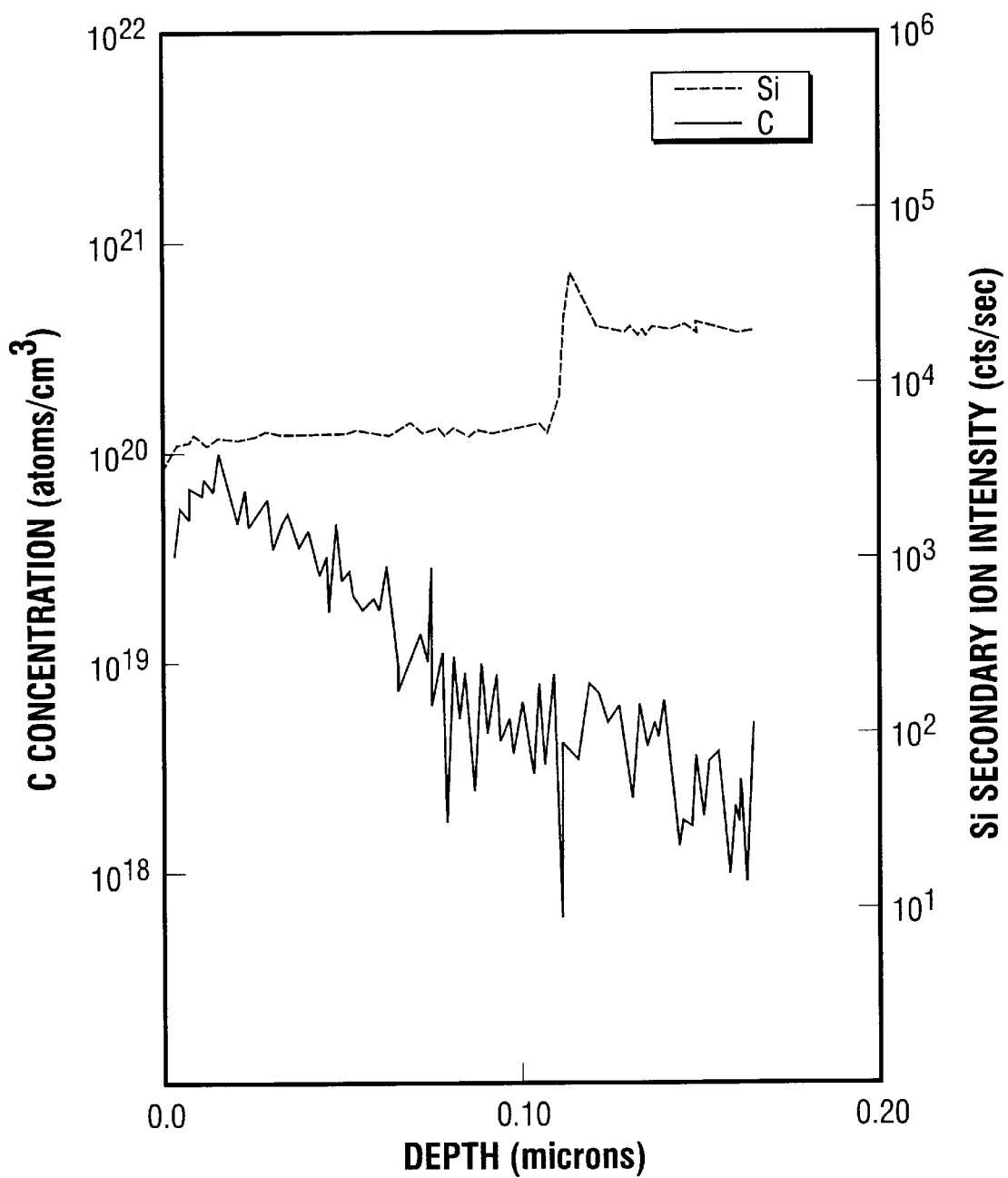
FIG. 3 is a diagram showing a depth profile analyzed by SIMS (Selected Ion Mass Spectroscopy) according to a first embodiment of the present invention.
Figure 4:
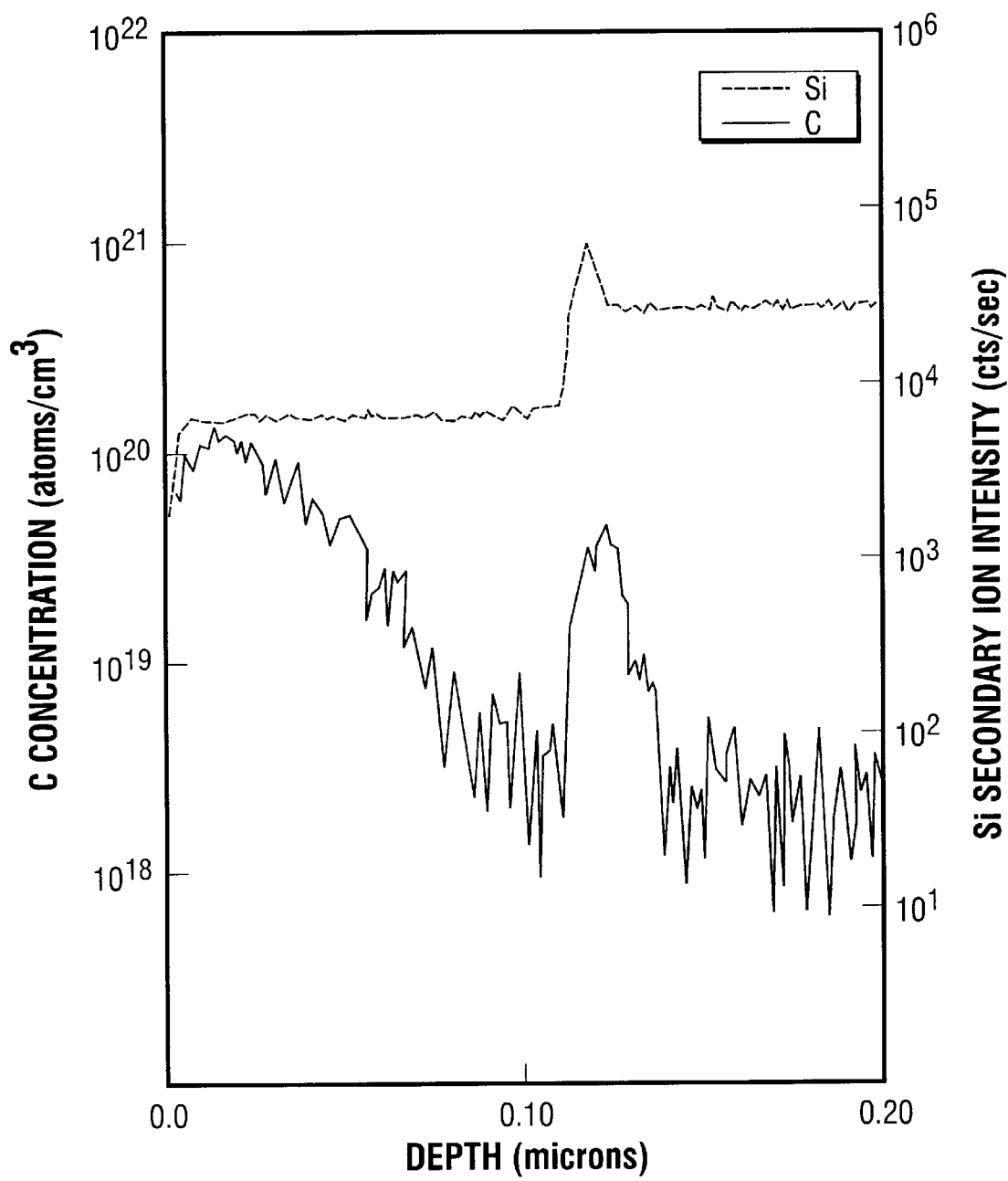
FIG. 4 is a diagram showing a depth profile of a sample which had not been subjected to the oxygen plasma treatment according to analysis by SIMS.

Further, FIG. 3 shows a depth profile according to analysis by SIMS with respect to carbon atom at the interface between the silicon wafer and the SiON film of the sample of this embodiment. FIG. 4 shows the depth profile for the sample which had not been subjected to the oxygen plasma treatment for comparison.

As a result, it shows that the carbon concentration at the interface between the silicon wafer and the SiON film becomes lower in the samples which had been subjected to the oxygen plasma treatment. This seems to have been caused since organic contaminants on the surface of the silicon wafer were cleaned by the oxygen plasma treatment before forming the SiON film.

Figure 7:
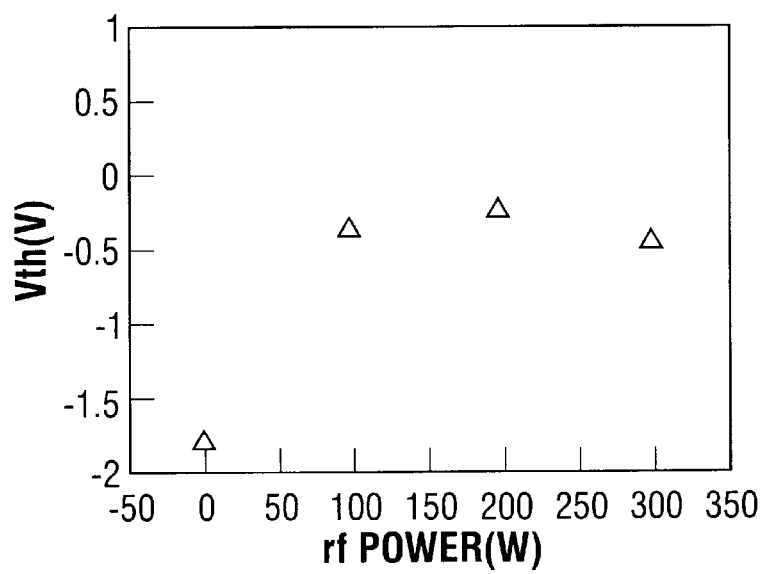
FIG. 7 is a diagram showing a flat band voltage in respect of the RF power according to a first embodiment of the present invention.

In this embodiment, oxygen was brought into a plasma state by applying 100 W of RF power, an effect similar to that in the embodiment was achieved when the RF power was set to 200 W and 300 W. FIG. 7 designates the flat band voltages respectively in the cases when the samples had not been subjected to the oxygen plasma treatment (when RF power is 0) and when the RF power of 100 W, 200 W and 300 W were applied, respectively.

In any cases, it is shown that the characteristic of the interface between the silicon wafer and the SiON film was promoted by the present invention.

Embodiment 2

This embodiment is an example of implementing the present invention in fabricating a thin film transistor is shown.

FIGS. 5(A) to 5(E) show steps of fabricating a transistor according to this embodiment. Firstly, a silicon oxide film or a silicon nitroxide film was formed on an alkali-free glass substrate 501 (for example, Corning 7059 glass substrate or Corning 1737 glass substrate) as an undercoating film 502. The thickness of the undercoating film 502 was set to 3000 Å.

The silicon oxide film was formed by a plasma CVD process using oxygen and silane, or using TEOS (Tetraethylorthosilicate). The silicon nitroxide film was formed by a plasma CVD process using oxygen, silane and $N_2O$ gas, or using TEOS and $N_2O$ gas.

Next, an amorphous silicon film, not shown, was formed through plasma CVD or low pressure thermal CVD. In this embodiment, the amorphous silicon film was formed by a thickness of 500 Å through plasma CVD.

Next, the amorphous silicon film was crystallized into a crystalline silicon film by using a heat treatment or irradiation of laser beam or both in combination.

By patterning the crystalline silicon film, a region 503 which was patterned in an island form as an activation layer of a thin film transistor in later steps. Next, a SiON film functioning as a gate insulating film 504 was formed thereon by a thickness of 1,000 Å. Although the gate insulating film 504 may be a silicon oxide film or a silicon nitroxide film, it is preferable to use a SiON film to promote further the reliability.

The SiON film was formed as follows.

Firstly, the pressure in the processing chamber was maintained at 0.1 to 10 torr, or 0.3 torr according to this embodiment, oxygen was introduced in the chamber at a flow rate of 200 SCCM and RF power of 100 W was applied by which oxygen was brought into a plasma state. The surface of the crystalline silicon film was treated by oxygen plasma in this way. The treatment was carried out for 30 seconds to 3 minutes, or 1 minute in this embodiment.

Thereafter, impurities caused by the oxygen plasma treatment were discharged by maintaining the inside of the processing chamber at the vacuum degree of $10^{-4}$ to $10^{-5}$ torr.

The treatment was repeated by a total of three times as shown by Embodiment 1.

Further, the SiON film was formed on the surface of the crystalline silicon film which had been treated as described above by a thickness of 1,000 Å.

Conditions of forming the SiON film were as follows.

RF power; 200 W

Gas flow rate; $SiH_4$: 10 SCCM, $N_2O$: 200 SCCM

Gas pressure; 0.3 torr

Film forming temperature; 350° C. to 400° C.

The SiON film was formed on the silicon wafer by a thickness of 1000 Å under these conditions.

Figure 5A:
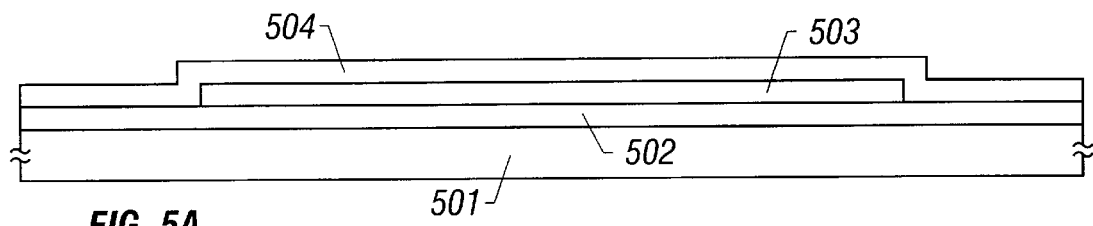
FIGS. 5(A), 5(B), 5(C), 5(D) and 5(E) are views showing manufacturing steps of a thin film transistor according to a second embodiment of the present invention.
Figure 5B:
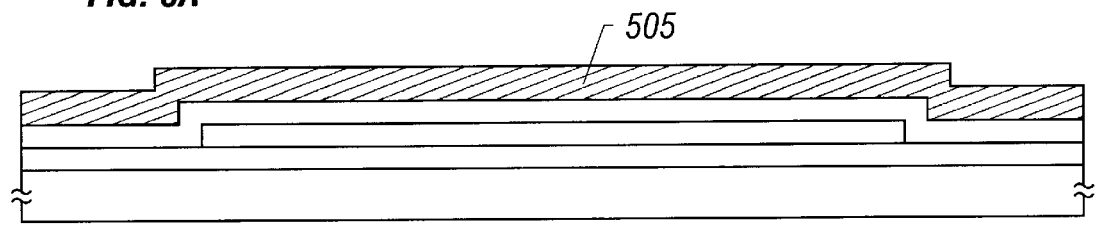

Thus a state illustrated by FIG. 5(A) was provided.

Next, an aluminum film 505 for constituting a gate electrode 507 was formed through sputtering by a thickness of 4,000 Å. The aluminum film may include 0.2 weight % of scandium.

Before forming the aluminum film 505 for constituting the gate electrode 507, the heating process was carried out at a temperature of 300° C. under pressure of $1 \times 10^{-6}$ torr to the SiON film for the gate insulating film 504. Thereafter the aluminum film 505 for a gate electrode 507 was formed on the gate insulating film 504 through sputtering. There is effective in promoting the characteristic of the interface between the gate electrode 507 and the gate insulating film 504.

Next, a resist mask (not shown) was formed by a publicly-known photolithography step and an etching was carried out. Thus, the pattern (gate electrode 507) made of aluminum was provided (FIG. 5(C)).

Figure 5C:
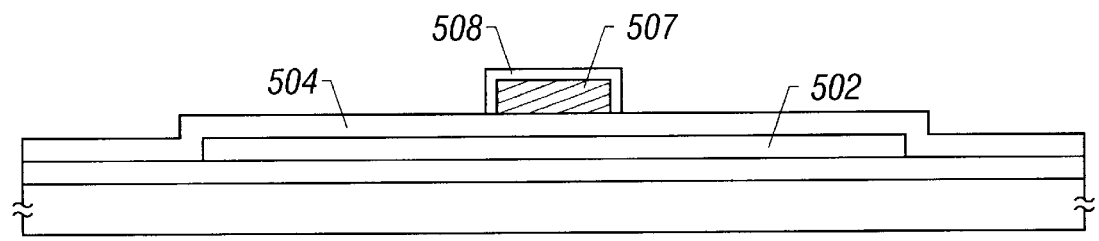

Next, anodic oxidation with gate electrode 507 as an anode as illustrated by FIG. 5(C) was carried out and an anodic oxidized film 508 having a dense film quality was formed by a thickness of 800 Å. The anodic oxidized film 508 functions for restraining occurrence of hillocks on the surface or side surfaces of the gate electrode 507.

It has been found that no problem is caused if the thickness of the dense anodic oxidized film 508 is 500 Å or more. The dense anodic oxidized film 508 was formed by using an ethylene glycol solution including 3% of tartaric aid as an electrolysis solution, and the anodic oxidation was carried out with the aluminum pattern as an anode and platinum as a cathode. The thickness of anodically oxidized film can be controlled by an applied voltage.

Figure 5D:
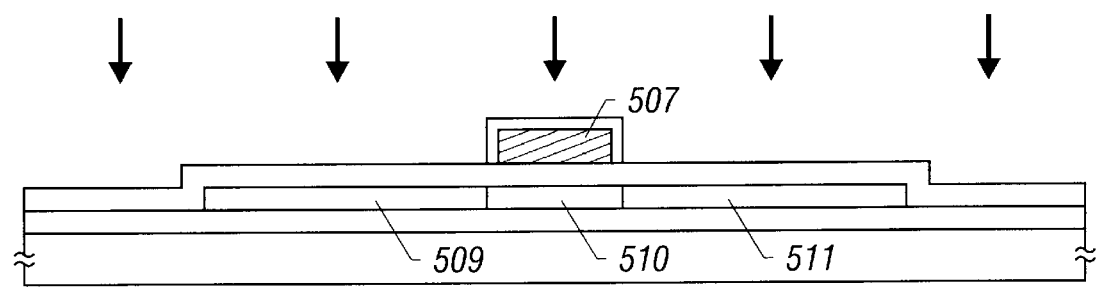

Next, implantation of impurity ions was carried out for forming source and drain regions 509 and 511 in a step illustrated by FIG. 5(D). In this step, impurity ions were implanted for forming the source and drain regions. Here, implantation of P (phosphor) ions was carried out all over the substrate through plasma doping (FIG. 5(D)).

When the implantation of impurity ions had been finished, an annealing process by radiation of laser beam was performed to the source and drain region 509 and 511.

Then the source region 509 and a channel forming region 510 and the drain region 511 were self-aligningly formed.

In this step, measures for restraining occurrence of hillocks owing to the implantation of impurity ions was conducted on the top portion of the gate electrode 507 (not shown). Further, measures of restraining occurrence of hillocks owing to the presence of the anodic oxidized film 508 was carried out. Therefore, occurrence of hillocks on the top surface of the gate electrode 507 was restrained.

Also, the side surfaces of the gate electrode 507 had only the anodic oxidized film 507 in order to restraining hillocks, however, the area of the side surfaces of the gate electrode 507 was small. Therefore the restraining of hillocks could sufficiently be effected by the anodic oxidized film 508.

Figure 5E:
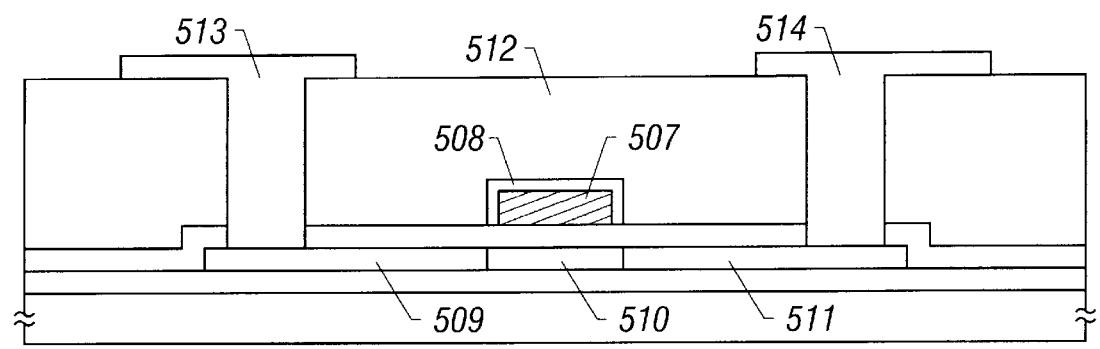

Next, a silicon oxide film or a silicon nitroxide film was formed as an inter-layer insulating film 512 as illustrated by FIG. 5(E). During the step, the substrate had been heated.

Also in this step occurrence of hillocks on the surface of the gate electrode (and gate wiring extended therefrom) could be restrained by the restraining effect owing to the implantation of impurity ions and the restraining effect by formation of the anodically oxidized film 508.

Thereafter, contact holes were formed in the inter-layer insulating film 512.

Next, an aluminum film for constituting a source electrode 513 and a drain electrode 514 was formed.

In this procedure, it was effective to improve the step coverage of the aluminum film to carry out a heating process at the temperature of 300° C. under pressure of $1 \times 10^{-6}$ torr to interlayer insulating film 512 before forming the aluminum film for constituting the source electrode 513 and the drain electrode 514 through sputtering.

Further, formation of contact holes in the gate electrode 507 was simultaneously carried out. In this procedure, impurity ions were implanted on the surface of the gate electrode 507 and measures for restraining occurrence of hillocks were carried out and therefore, occurrence of hillocks in this step could be restrained.

Finally, a heating process at 300° C. to 400° C., or 350° C. in this embodiment under a hydrogen atmosphere was carried out, and a thin film transistor was completed. Also in this step occurrence of hillocks could be restrained.

As described above, the thin film transistor was completed by using the present invention.

The threshold voltage of the thin film transistor was measured with a result of 0.3 V. The threshold voltage of a thin film transistor prepared without executing the present invention for comparison was −1.1 V. Thereby, it shows that the thin film transistor of which threshold voltage was shifted in the positive direction was provided by carrying out the present invention.

Figure 6:
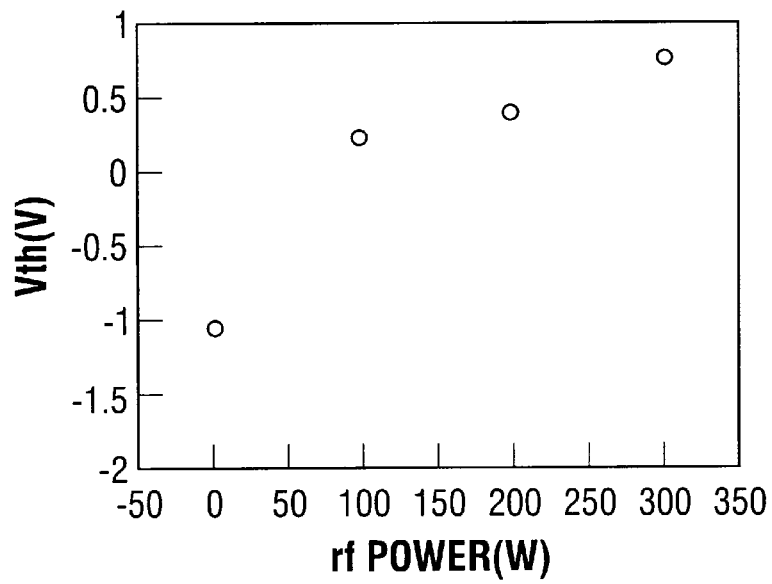
FIG. 6 is a diagram showing a threshold voltage in respect of RF (Radio Frequency) power according to a second embodiment of the present invention.

Although in this embodiment, the RF power for producing oxygen plasma was 100 W, FIG. 6 indicates the threshold voltages of the thin film transistor provided by setting the RF power at 0, 100, 200 and 300 W. The value at the RF power of 0 indicates the threshold voltage when the present invention was not executed. It is apparent that the effect of the present invention is shown in any of the RF powers.

Embodiment 3

This embodiment shows an example where in forming a SiON film, oxygen was added.

To evaluate a SiON film provided by this embodiment, the C-V characteristic and the relation between field intensity and current were measured by a method similar to that in Embodiment 1.

Firstly, a P-type single crystal silicon wafer having the resistivity of 2 to 3 Ω cm was prepared as a sample and the SiON film was formed thereon.

The SiON film formed on the surface of the silicon wafer by a thickness of 1,000 Å.

Conditions of forming the SiON film were as follows.

RF power; 200 W

Gas flow rate; $SiH_4$: 10 SCCM, $N_2O$: 180 SCCM, $O_2$: 20 SCCM

Gas pressure; 0.3 torr

Film forming temperature; 350° C. to 400° C.

Under these conditions, the SiON film was formed on the silicon wafer by a thickness of 1,000 Å.

Next, an aluminum electrode was provided in contact with the silicon wafer through sputtering and an aluminum electrode was provided also on the SiON film whereby samples for measurement were prepared.

The C-V characteristic was measured to show the effect of the present invention. According to the method, firstly, the characteristic was measured at the frequency of 1 MHz and by varying voltage from −10 V to 10 V and thereafter, voltage of −17 V was applied on the aluminum electrode on the silicon oxide film and the B-T treatment was carried out at a temperature of 150° C. for 1 hour in a nitrogen atmosphere. Thereafter, the measurement of the C-V characteristic was carried out again at the frequency of 1 MHz and by varying the voltage from −10 V to 10 V. Furthermore, thereafter, voltage of +17 V was applied on the aluminum electrode on the silicon oxide film and the B-T treatment was carried out at the temperature of 150° C. for 1 hour in a nitrogen atmosphere. Next, the measurement of the C-V characteristic was carried out at the frequency of 1 MHz and by varying the voltage from −10 V to 10 V.

Figure 8A:
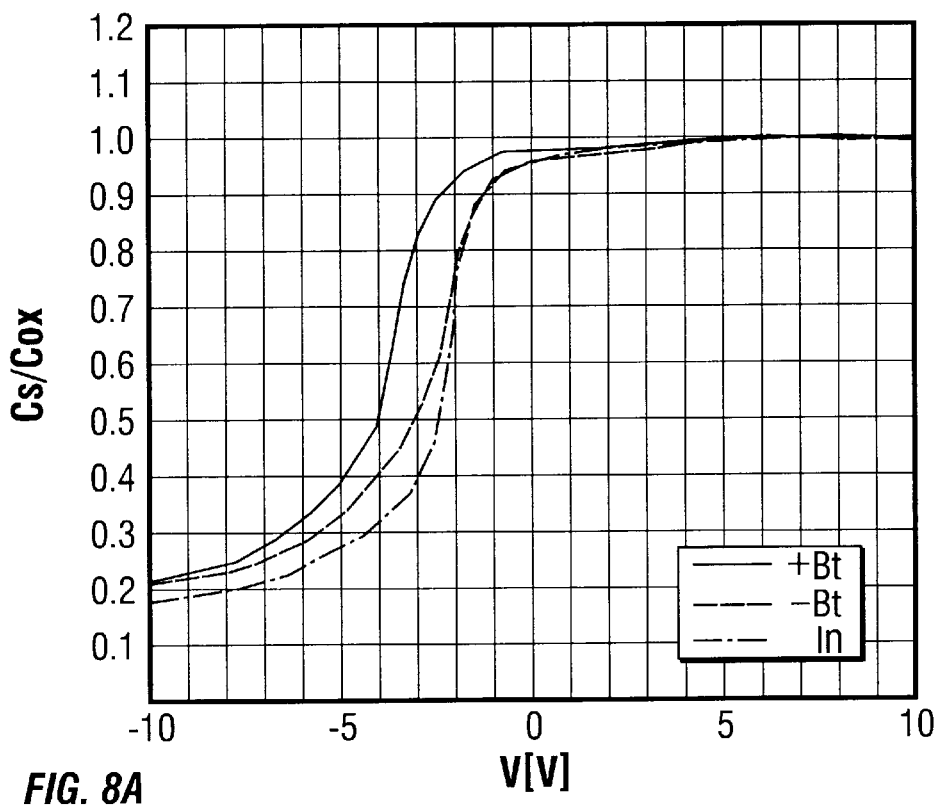
FIGS. 8(A) and 8(B) are diagrams showing C-V characteristics according to a third embodiment of the present invention.

These results are shown in FIG. 8(A).

Figure 8B:
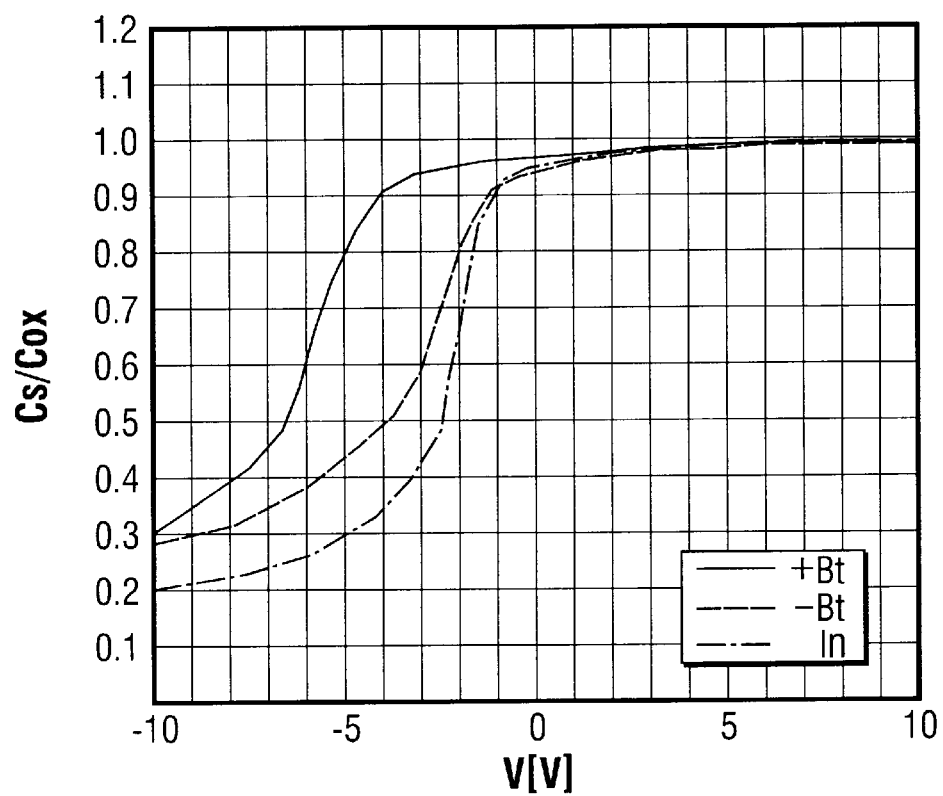

In FIG. 8(A) notation In designates a sample where the B-T treatment had not been carried out, notation −BT designates a sample where the B-T treatment had been carried out by applying voltage of −17 V thereon and notation +BT designates a sample where the B-T treatment had been carried out by applying voltage of +17 V. FIG. 8(B) indicates the results of the C-V characteristic of the SiON film which had been formed without adding oxygen for comparison. The film forming conditions in that case were as follows.

RF power; 200 W

Gas flow rate; $SiH_4$: 10 SCCM, $N_2O$: 200 SCCM

Gas pressure; 0.3 torr

Film forming temperature; 350° C. to 400° C.

It shows that the flat band voltage was shifted in the positive direction in the case where oxygen was added in accordance with the present invention compared with the case where oxygen was not added and it is known that the BT shift was decreased.

Figure 9A:
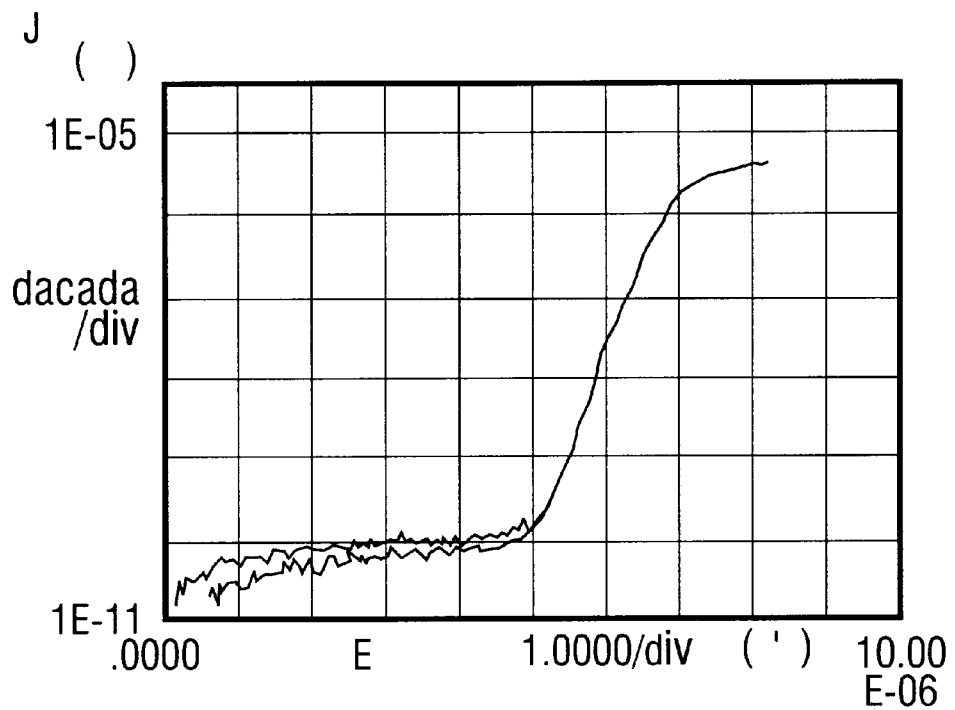
FIGS. 9(A) and 9(B) are diagrams showing relations between field intensity and current according to a third embodiment of the present invention.
Figure 9B:
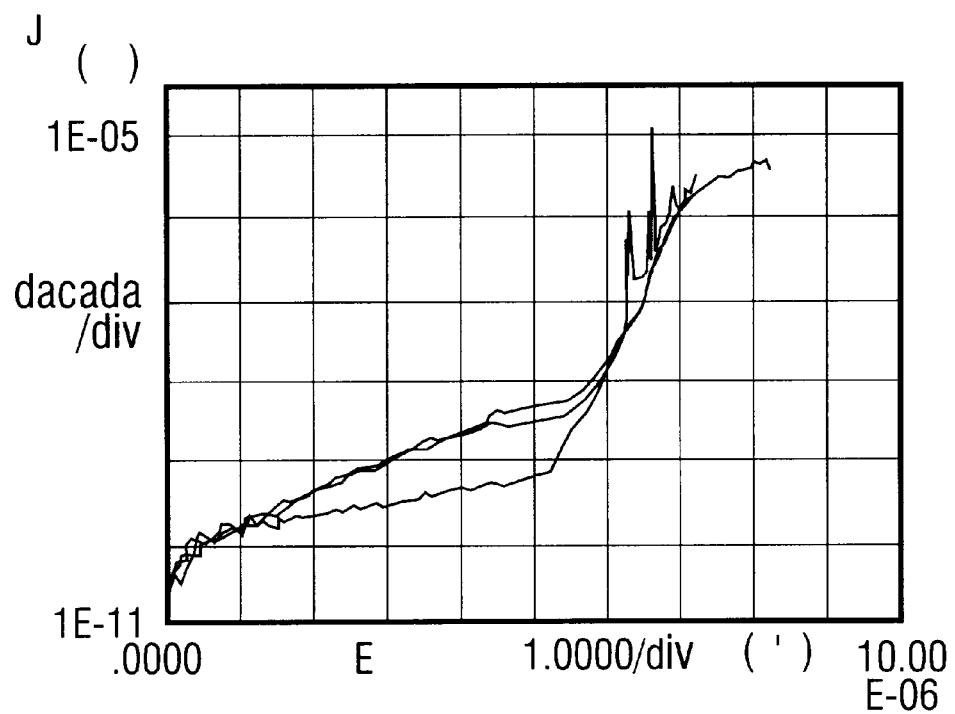

FIGS. 9(A) and 9(B) show relations between field intensity and current provided by the samples prepared in this embodiment with field intensity as abscissa and current as ordinate. Also in this case FIG. 9(B) indicates the measurement results of a SiON film which had been formed without adding oxygen for comparison.

It shows that the leakage current was smaller in the samples which had been formed by adding oxygen than that in the samples where the present invention had not been executed.

Further, in this embodiment the example has been shown in the case where the film was formed under conditions of $SiH_4/N_2O/O_2$ of 10/180/20 SCCM, the same effect was achieved also in the case where the film was formed under conditions of $SiH_4/N_2O/O_2$ of 10/160/40 SCCM.

In the step of forming an insulating film, a surface on which the insulating film is to be formed is previously exposed to activated oxygen and thereafter, the insulating film is formed on the surface by which the flat band voltage is shifted in the positive direction and the BT shift is also decreased, compared with the case where the surface is not exposed to activated oxygen. Therefore, the state of the interface between the insulating film and the surface on which the insulating film is to be formed can be improved.

In the step of forming an insulating film for fabricating a thin film transistor, a semiconductor layer is exposed to activated oxygen and thereafter, the insulating film is formed on the semiconductor layer by which the flat band voltage is shifted in the positive direction and the BT shift is also decreased, compared with the case where the semiconductor layer is not exposed to activated oxygen. Therefore the state of interface can be improved.

In steps of fabricating a thin film transistor, the threshold voltage can be shifted in the positive direction by forming an insulating film with monosilane, dinitrogen monoxide and oxygen as raw materials by which the control of the threshold voltage can be realized.

What is claimed is:

1. A method of forming a semiconductor device comprising the steps of:

exposing a surface of a semiconductor to a plasma containing oxygen in a reaction chamber at a first pressure in order to remove impurities from said semiconductor;

after said exposing, maintaining said reaction chamber with said semiconductor at a second pressure in order to discharge said impurities from said reaction chamber, and forming an insulating film on said surface after said maintaining, wherein said second pressure is lower than said first pressure.

2. A method according to claim 1, wherein said semiconductor is a crystalline semiconductor layer comprising silicon and said insulating film comprises silicon, oxygen, and nitrogen.

3. A method according to claim 1, wherein said exposing step and said maintaining step are alternatively repeated three times.

4. A method according to claim 1, wherein said first pressure is 0.1 to 10 torr and said second pressure is $1 \times 10^{-4}$ to $1 \times 10^{-5}$ torr, respectively.

5. A method of fabricating a semiconductor device comprising the steps of:

forming a semiconductor film comprising silicon over a substrate having an insulating surface;

crystallizing said semiconductor film;

patterning said semiconductor film into at least one semiconductor island;

processing said semiconductor island by a plasma containing oxygen in a reaction chamber in order to remove impurities from said semiconductor island;

discharging the impurities removed by said plasma containing oxygen from said reaction chamber, and forming a gate insulating film on said semiconductor island after said discharging.

6. A method according to claim 5, wherein said gate insulating film is formed through chemical vapor deposition with monosilane, dinitrogen monoxide and oxygen as raw materials.

7. A method according to claim 5, wherein said processing step and said discharging step are alternately repeated three times.

8. A method according to claim 5, wherein said processing is performed at pressure of 0.1 to 10 torr and said discharging is performed at pressure of $1\times10^{-4}$ to $1\times10^{-5}$ torr, respectively.

9. A method of fabricating a semiconductor device comprising the steps of:

forming a semiconductor film comprising silicon over a substrate having an insulating surface;

crystallizing said semiconductor film;

removing impurities comprising carbon from said crystallized semiconductor film by a plasma containing oxygen in a reaction chamber maintained at a first pressure;

discharging the impurities removed by said plasma containing oxygen from said reaction chamber maintained at a second pressure; and after said discharging, forming a gate insulating film on said semiconductor film, wherein said second pressure is lower than said first pressure.

10. The method of claim 9 wherein said crystallizing step is conducted by a heat treatment.

11. The method of claim 9 wherein said crystallizing step is conducted by a laser irradiation.

12. The method of claim 9 wherein said crystallizing step is conducted by a heat treatment and a laser irradiation.

13. A method according to claim 9, wherein said removing step and said discharging step are alternately repeated three times.

14. A method according to claim 9, wherein said first pressure is 0.1 to 10 torr and said second pressure is $1\times10^{-4}$ to $1\times10^{-5}$ torr, respectively.

* * * * *